(12) United States Patent
Robinson

(10) Patent No.: US 8,686,379 B1
(45) Date of Patent: *Apr. 1, 2014

(54) METHOD AND APPARATUS FOR PREPARING SERIAL PLANAR CROSS SECTIONS

(76) Inventor: Joseph C. Robinson, Portland, OR (US)

( * ) Notice: Subject to any disclaimer, the term of this patent is extended or adjusted under 35 U.S.C. 154(b) by 257 days.

This patent is subject to a terminal disclaimer.

(21) Appl. No.: 13/227,441

(22) Filed: Sep. 7, 2011

Related U.S. Application Data

(60) Provisional application No. 61/380,631, filed on Sep. 7, 2010.

(51) Int. Cl.
- H01J 37/08 (2006.01)
- G21K 5/10 (2006.01)
- G01F 23/00 (2006.01)
- H01J 29/46 (2006.01)
- C23C 14/32 (2006.01)

(52) U.S. Cl.
USPC ... 250/492.21; 250/307; 250/309; 250/492.3; 250/505.1

(58) Field of Classification Search
USPC ............ 250/304, 306, 307, 309–311, 396 R, 250/398, 423 R, 423.311, 424, 440.11, 250/441.11, 442.11, 442, 451, 452.2, 458, 250/491, 492 A, 491.1, 492.1, 492.2, 250/492.21, 492.3, 505.1, 525.1, 52; 219/121.12, 121.14, 121.18, 121.2, 219/121.68, 121.69; 216/66, 83–85, 87, 94, 216/95, 99, 100; 204/192.34
See application file for complete search history.

(56) References Cited

U.S. PATENT DOCUMENTS

| | | | |
|---|---|---|---|
| 3,622,782 A | 11/1971 | Smith et al. | |
| 4,128,765 A | 12/1978 | Franks | |
| 4,381,453 A | 4/1983 | Cuomo et al. | |
| 4,574,179 A | 3/1986 | Masuzawa et al. | |
| 4,658,143 A | 4/1987 | Tokiguchi et al. | |
| 5,472,566 A | 12/1995 | Swann et al. | |
| 5,907,157 A | 5/1999 | Yoshioka et al. | |
| 5,986,264 A | 11/1999 | Grunewald | |
| 6,333,485 B1 | 12/2001 | Haight et al. | |
| 6,710,918 B2 | 3/2004 | Birk et al. | |
| 6,768,110 B2 | 7/2004 | Alani | |
| 7,129,485 B2* | 10/2006 | Nakasuji et al. | 250/310 |
| 7,692,768 B2* | 4/2010 | Binnard et al. | 355/67 |
| 7,700,931 B2 | 4/2010 | Shichi et al. | |
| 7,722,818 B2* | 5/2010 | Hasegawa et al. | 422/502 |
| 8,247,782 B2* | 8/2012 | Edinger et al. | 250/396 R |
| 2004/0108067 A1* | 6/2004 | Fischione et al. | 156/345.38 |

(Continued)

OTHER PUBLICATIONS

V. V. Pletnev et al., "Coefficient of Surface Sputtering of Solids by Light Ions", translated from Atomnaya Energiya, vol. 69, No. 2, Aug. 1990 (original article submitted Sep. 26, 1988), pp. 104-106.

(Continued)

*Primary Examiner* — Bernard E Souw
(74) *Attorney, Agent, or Firm* — Kolisch Hartwell, P.C.

(57) ABSTRACT

Systems for preparing solid samples for microscopic examination in cross section or planametric orientation. The sample preparation systems include a sample support, an excitation beam to remove material from the surface of the sample, and a beam shield that protects the sample from the excitation beam, where sequential vertical adjustment of the beam shield permits the selective exposure of a series of substantially planar sample surfaces.

26 Claims, 1 Drawing Sheet

(56) References Cited

U.S. PATENT DOCUMENTS

| | | | |
|---|---|---|---|
| 2004/0183013 A1* | 9/2004 | Nakasuji et al. | 250/310 |
| 2005/0230621 A1* | 10/2005 | Edinger et al. | 250/311 |
| 2006/0011865 A1* | 1/2006 | Migeon et al. | 250/492.3 |
| 2008/0002173 A1* | 1/2008 | Binnard et al. | 355/67 |
| 2008/0042059 A1* | 2/2008 | Tashiro et al. | 250/307 |
| 2008/0067443 A1 | 3/2008 | Todoroki et al. | |
| 2008/0237491 A1* | 10/2008 | Caliendo et al. | 250/492.3 |
| 2008/0237492 A1* | 10/2008 | Caliendo et al. | 250/492.3 |
| 2008/0285003 A1* | 11/2008 | Binnard et al. | 355/71 |
| 2009/0057574 A1* | 3/2009 | Wagner et al. | 250/492.21 |
| 2012/0205538 A1* | 8/2012 | Schertel | 250/307 |
| 2013/0174301 A1* | 7/2013 | Robinson | 850/33 |

OTHER PUBLICATIONS

Richard Haight et al., "MARS: Femtosecond laser mask advanced repair system in manufacturing", Journal of Vacuum Science and Technology B: Microelectronics and Nanometer Structures, vol. 17, Issue 6, 1999, pp. 3137-3143.

R. Alani et al., "Instrumentation for SEM Specimen Preparation of Semiconductors", Recent Advances in Broad Ion Beam Techniques, Semiconductor International, Feb. 1, 2000, 5 pgs.

R.M. Langford et al., "Broad ion beam milling of focused ion beam prepared transmission electron microscopy cross sections for high resolution electron microscopy", Journal of Vacuum Science and Technology A: Vacuum, Surfaces, and Films, vol. 19, Issue 3, May 2001, pp. 982-985.

W. Hauffe et al., "3D Microscopy and Microanalysis of Heterogeneous SEM Samples by Broad Ion Beam Processing: Cutting-Etching-Coating", Microscopy and Microanalysis, vol. 8, Supplement S02, 2002, pp. 552-553.

Alfred Wagner et al., "MARS2: An Advanced Femtosecond Laser Mask Repair Tool", IBM Semiconductor Research and Development Center (SRDC) Research Division, Yorktown Heights, NY, Dec. 27, 2002, 12 pgs.

W. Hauffe, "Broad Ion Beam (BIB) Slope Cutting Through Sn-Coated Copper Wires for 3D Scanning Electron Microscopy and Microanalysis", Microscopy and Microanalysis, vol. 13, Supplement S02, 2007, pp. 1526-1527.

Kazumichi Ogura et al, "New Methods for Cross-Section Sample Preparation Using Broad Argon Ion Beam", Microscopy and Microanalysis, vol. 13 , Supplement S02, 2007, pp. 1518-1519.

N.S. Smith et al., "A high brightness source for nano-probe secondary ion mass spectrometry", Applied Surface Science, vol. 255, Issue 4, Dec. 15, 2008, available for download May 14, 2008, pp. 1606-1609.

Kenneth Maclean et al., "Measuring Charge Transport in a Thin Solid Film Using Charge Sensing", ACS Publications, NANO Letters, vol. 10(3), Feb. 23, 2010, pp. 1037-1040.

M. Petzold et al., "Micro Structure Analysis for System in Package Components—Novel Tools for Fault Isolation, Target Preparation, and High-Resolution Material Diagnostics", 60th Electronic Components and Technology Conference, Part 2 : Jun. 1-4, 2010, pp. 1296-1302.

* cited by examiner

METHOD AND APPARATUS FOR PREPARING SERIAL PLANAR CROSS SECTIONS

CROSS-REFERENCE TO RELATED APPLICATIONS

This application claims the benefit under 35 U.S.C. §119 (e) of U.S. Provisional Patent Application Ser. No. 61/380,631 titled SYSTEM FOR IN SITU PREPARATION OF PLANAR SURFACES filed Sep. 7, 2010, which is hereby incorporated by reference.

TECHNICAL FIELD

This application is directed to the preparation of samples for microscopy. In particular, the application is directed to the preparation of sequential planar surfaces on a microscopy sample.

BACKGROUND

The ongoing revolution in the preparation of nano-engineered materials continues to spawn new combinations of elements and compounds. Many of these new materials may include exotic phase mixtures (composites) or layered thin film structures (devices), resulting in new and unusual properties that may result directly from the spatial relationships and nano-structural arrangements of the material components. Increasingly, these new materials must be characterized at the molecular or atomic level using microscopy techniques such as Scanning Probe Microsocopy (SPM), Transmission Electron Microscopy (TEM), and Scanning Electron Microscopy (SEM), among others.

Sample preparation for multi-phase materials traditionally involves embedding the sample in a support matrix followed by abrasive polishing or microtome slicing to achieve a smooth surface or thin section. In the case of layered thin film devices, the samples were generally cleaved (broken) or otherwise cut into smaller pieces, sandwiched between support materials, and then polished smooth. These techniques were well-suited for materials that could withstand abrasive reduction and where charging effects could be circumvented by the addition of a conductive path.

The use of focused ion beam (FIB) systems has became a valuable, albeit time consuming, tool for sampling precise site-specific sub-surface features in multi-phase materials or thin film devices. Though FIBs have become faster at removing a wide range of materials, the excavated area is typically very small (2,000 $\mu m^3$). In addition, many novel materials may contain organic fibers and polymers, rendering them less suitable for FIB milling due to an associated charge build-up or adverse sputtering properties.

Increasingly, new combinations of exotic materials used in multi-phase and multi-layered thin films are poorly-suited to either mechanical polishing or FIB milling. Softer materials tend to smear or become delaminated from neighboring structures, while hard or brittle materials may fracture or shed particles into neighboring regions, either result constituting an unacceptable alteration of the original structure of the sample material. Similarly, composite materials may exhibit distortion of discrete grains or phases as a result of the shearing forces of polishing, altering critical spatial information and introducing chemical anomalies that affect subsequent EDX or surface analysis results.

Examples of sample preparation and microscopic analyses may be found in the following references: Alani et al., Instrumentation for SEM Specimen Preparation of Semiconductors, Recent Advances in Broad Ion Beam Techniques, Feb. 1, 2000; Wagner et al., MARS2: An Advanced Femtosecond Laser Mask Repair Tool, Oct. 3, 2002; Smith et al., Applied Surface Science 255 (2008) 1606-1609; Langford et al., J. Vac. Sci. Technol. A19, 982 (2001); Pletnev et al., Coefficient of Surface Sputtering of Solids by Light Ions, Atomnaya Energiya, Vol. 69, No. 2, pp. 104-106, Sep. 26, 1988; Hauffe et al., 3D Microscopy and Microanalysis of Heterogeneous SEM Samples by Broad Ion Beam Processing: Cutting-Etching-Coating, 1997; Hauffe, Broad Ion Beam (BIB) Slope Cutting through Sn-Coated Copper Wires for 3D Scanning Electron Microscopy and Microanalysis, Microsc Microanal 13 (Suppl 2) 2007; Ogura et al., New Methods for Cross-Section Sample Preparation Using Broad Argon Ion Beam, Microsc Microanal 13(Suppl 2), 2007; Haight et al., J. Vac. Sci. Technol. B 17, 3137 (1999); MacLean et al., Nano Lett., 2010, 10(3), pp 1037-1040; Petzold et al., Micro Structure Analysis for System in Package Components—Novel Tools for Fault Isolation, Target Preparation, and High-resolution Material Diagnostics, Electronic Components and Technology Conference ECTC, Las Vegas, Session 29, Apr. 6, 2010, each of which is hereby incorporated by reference.

Selected examples of sample preparation and microscopic analyses may be found in the following patent documents: Todoroki et al., U.S. Patent Appl. Publ., US 2008/0067443 A1; Smith, U.S. Pat. No. 3,622,782; Franks, U.S. Pat. No. 4,128,765; Masuzawa et al., U.S. Pat. No. 4,574,179; Tokiguchi et al., U.S. Pat. No. 4,658,143; Swann et al., U.S. Pat. No. 5,472,566; Yoshioka et al., U.S. Pat. No. 5,907,157; Grünewald, U.S. Pat. No. 5,986,264; Birk et al., U.S. Pat. No. 6,710,918; Alani, U.S. Pat. No. 6,768,110; Shichi et al., U.S. Pat. No. 7,700,931; Cuomo et al., U.S. Pat. No. 4,381,453; and Haight et al., U.S. Pat. No. 6,333,485, the disclosures of each of which are hereby incorporated by reference for any and all purposes.

SUMMARY

The invention is directed to systems for preparing solid samples for analysis, and the use of such systems to prepare analytical samples. The disclosed sample preparation systems include a sample support, an excitation beam to remove material from the surface of the sample, and a beam shield that protects the sample from the excitation beam, where sequential vertical adjustment of the beam shield permits the selective exposure of a series of substantially planar sample surfaces.

DETAILED DESCRIPTION

In 1991 Hauffe described and published a technique for masked broad ion beam milling of samples for microscopy whereby a thin layer of material is etched away from the top surface of a solid sample leaving a topographically planar surface acceptable for microscopic examination and analysis. H is method, commonly known as "slope cutting" uses a conventional broad ion beam directed at the sample parallel to its top surface. A masking material is positioned at a low glancing angle just below the top surface of the sample and acts as a partial beam barrier, allowing milling of only the material above the top edge of the masking material. The top edge of the barrier is beveled at an angle between 0° and 10° to the sample surface and blocks the lower part of the beam. When the beam strikes the low angled barrier surface, an extremely planar erosion of the sample surface occurs on the portion of the sample that protrudes above the masking material. Over time, a uniform thickness of material is removed from a large area.

Unfortunately, sample preparation using this technique is time-consuming. The throughput is limited to a single thinning session taking from one to two hours on a single sample. If the area of interest is not accurately exposed, the sample must be discarded or mechanically processed into a suitable state for starting over again.

Furthermore, once a sample is removed from the processing chamber, it becomes impossible to re-introduce the sample in a sufficiently reproducible position to allow additional thinning of the area of interest. The use of a beam shield affixed to the sample itself limits reprocessing to simply varying the ion beam incidence angle, but higher angle milling can cause increased redeposition, topographical artifacts, and increased heat buildup.

The sample preparation apparatus disclosed herein employs sample preparation in situ, that is, inside the vacuum chamber of an electron or other microscope or analytical instrument where the ongoing progress and quality of the surface can be monitored via high resolution microscopical techniques in real time. Furthermore, by virtue of in situ integration, additional analytical data can be captured contemporaneously. Secondary ion, auger, EBSD, X-ray, and other compositional data emitted during excitation can be acquired. Furthermore, the finished sample is available for immediate viewing and analysis by collecting electron, ion, or light images directly following the thinning, and without breaking vacuum; thereby eliminating the formation of oxidative and other reactive artifacts.

Figure 1:
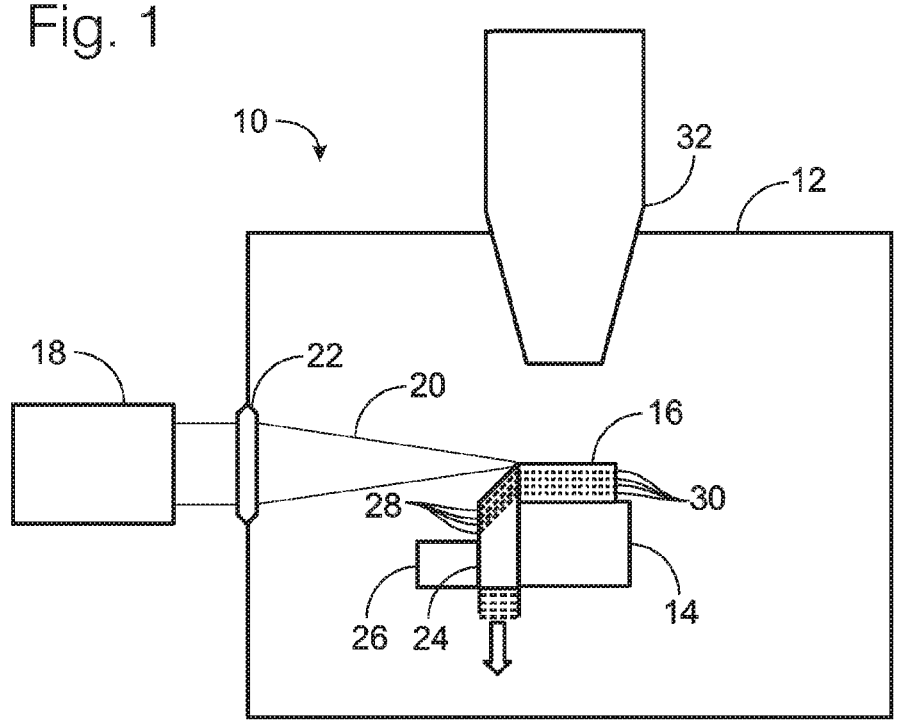
FIG. 1 is a schematic showing a sample preparation system according to an embodiment of the present invention.

FIG. 1 shows a schematic representation of a microscope or analytical instrument 10 incorporating a sample preparation system according to one embodiment of the present invention. The microscope or analytical instrument includes a vacuum chamber 12 for sample preparation and examination. Within the vacuum chamber 12 is a sample support 14 for securely mounting the solid sample 16 of interest. An excitation beam source 18 generates an excitation beam 20 that is configured to remove material from the surface of the sample 14. The excitation beam of FIG. 1 is focused by lens 22.

Adjacent sample 16 is a beam shield 24, where the beam shield is configured to protect the lower portion of sample 14 from the excitation beam 20, and the beam shield 24 is secured in a beam shield holder 26 that is itself configured to adjustably secure the beam shield.

The beam shield 24 and beam shield holder 26 are configured so that the beam shield can be at least vertically adjusted. As shown in FIG. 1, beam shield 24 may be sequentially lowered, as represented by dashed lines 28. By progressively lowering the beam shield 24 adjacent the sample 16, the excitation beam 20 is permitted to selectively and sequentially mill a series of substantially planar surfaces of the solid sample, as shown by dashed lines 30.

The apparatus of FIG. 1 is designed and configured to prepare sequential planar surfaces on a single solid sample, facilitating simultaneous examination and analysis by a detector or detection system 32. The analytical instrument may be any instrument that would benefit from the ability to view sequential sections of a sample in real time. Typically, the analytical instrument is a microscope, such as a light microscope (LM), scanning electron microscope (SEM), focused ion beam (FIB), or atomic force microscope (AFM), among others. The analytical instrument may incorporate any of a variety of detectors, such as secondary electron, backscattered electron, secondary ion, auger, x-ray or photon sensitive devices acquiring signals emitted from or reflected off the processing area during or after the surface processing. The surface preparation system disclosed herein does not interfere with any of the primary imaging or secondary analytical capabilities of the host vacuum instrument.

The surface preparation system typically includes a positive-positioned, self-aligning sample support configured to position a sample of interest in the correct coincident point in space for both processing and viewing.

The beam shield of the device is typically placed and oriented such that the upper-most edge of the beam shield is positioned just below (~10 μm) the sample surface and parallel to the normal surface of the sample. The upper part of the beam shield is typically beveled at an angle between 0 and 10 degrees from parallel to the sample surface plane and therefore at approximately 80 to 90 degrees from perpendicular to the side wall of the sample.

The surface preparation system is typically constructed so that the excitation source bombards both the beveled portion of the beam shield and the portion of the sample that is exposed above the beam shield. The excitation source may be any of a wide variety of energy beams that are suited for material removal. Selection of a particular beam species may depend on the nature of the sample, including sample integrity, desired material removal rates, susceptibility of the sample to heat damage, and the likelihood of artifact generation. Suitable excitation sources include (without limitation), electron beams, ion beams (such as LMIS, plasma, Penning), X-rays, lasers and ultrafast lasers (including excimer lasers, $CO_2$ lasers, Nd/YAG lasers, and Ti-sapphire lasers, among others).

The excitation source typically produces a beam that is optimized for removing material from the sample such as by sputtering or ablation. During and after the surface processing (thinning) cycle, the area processed by the excitation source may be simultaneously imaged by any conventional means, including optical or electron microscopy, among others.

Between surface processing (thinning) cycles, the beam shield may be lowered an incremental vertical distance while the sample remains stationary. This facilitates the removal of additional material from the sample surface during the next surface processing (thinning) cycle. The subsequent material removed from the sample corresponds to the newly exposed area resulting from lowering the beam shield. Subsequent lowering of the beam shield removes incremental parallel slices of the sample from the same approximate lateral area. Where such sequentially exposed areas of the sample are imaged in sequence, the images may be used to reconstruct a 3-dimensional representation of various features previously embedded in the solid matrix of the sample. A variety of commercially available imaging software packages may be used to prepare such a reconstruction.

In order to achieve a substantially planar sample surface, the material removal process may require rotary oscillation of the sample through an arc around the beam axis center during the surface processing to prevent a "curtaining" affect caused by differential material removal rates in areas of the sample composed of materials having differing surface properties. In order to compensate for curtaining, the sample is rotated through an arc of variable angle optimized for minimal curtaining.

The surface preparation system of the disclosure permits exchanging samples without changing the beam shield or alternatively, exchanging beam shields without changing samples to allow introduction of new samples and replacement of spent beam shields.

In another aspect of the device, the beam shield may include multiple slits, to create defined recesses in the sample at desired intervals. The beam shield may incorporate a louvered stack of multiple slats periodically spaced to enable material removal at defined intervals. If the louvered slats have an optimal angle and narrow enough periodicity, they may result in diffraction of the beam resulting in very thin samples which would be suitable for TEM (Transmission electron microscope) analysis.

The beam shield may be manufactured of any material having sufficient durability to withstand repeated exposure to the energy beam. In particular, the beam shield may be manufactured using a refractory or crystalline material having optimal optical and sputtering resistant properties. Alternatively, the beam shield may be prepared using a relatively inexpensive material that may not possess beam-resistant properties, thereby requiring the deposition of a refractory coating onto the material. The coating may be applied by any conventional method, including evaporation, chemical vapor deposition, or powder coating followed by mechanical polishing.

Figure 2:
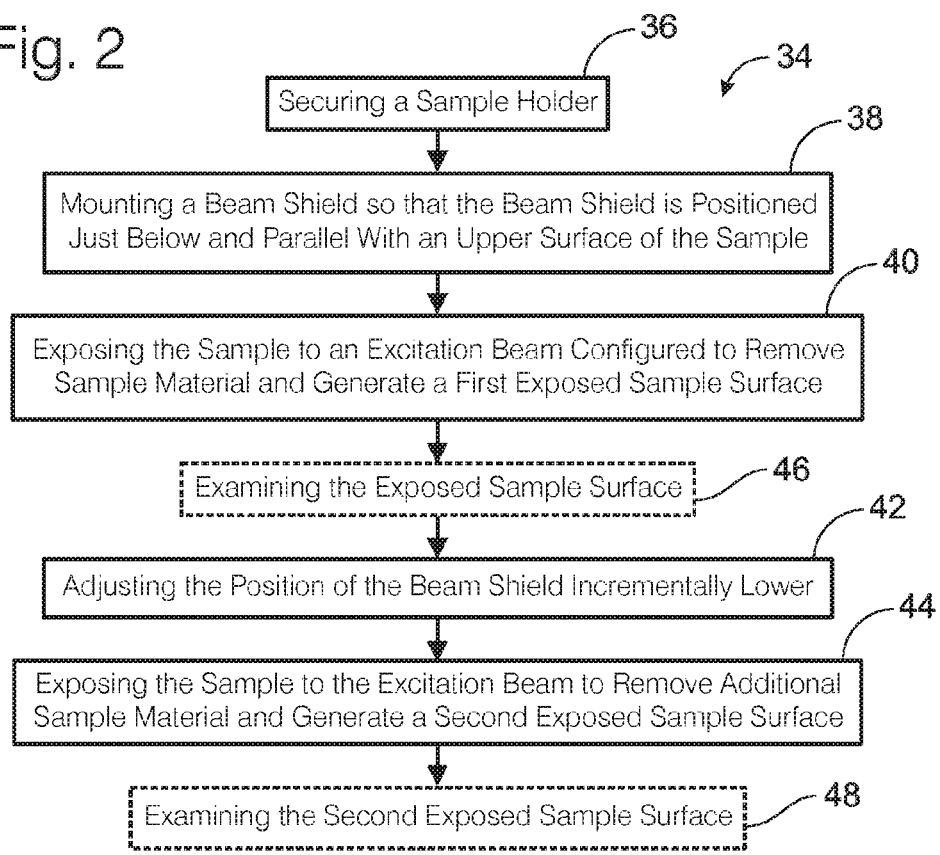
FIG. 2 is a flowchart illustrating a method of sample preparation according to an embodiment of the present invention.

The disclosed apparatus lends itself to a method of sample preparation, as represented in FIG. 2 by flowchart 34. The method includes securing a sample in a sample holder, at 36; mounting a beam shield so that the beam shield is positioned just below and parallel with an upper surface of the sample, at 38; exposing the sample to an excitation beam configured to remove sample material and generate a first exposed sample surface, at 40; adjusting the position of the beam shield incrementally lower, at 42; and exposing the sample to the excitation beam to remove additional sample material and generate a second exposed sample surface, at 44. The method of flowchart 34 optionally includes examination of the sample surface. More specifically upon generating the first exposed sample surface, the method optionally includes examining the exposed sample surface, at 46. Similarly, after generating the second exposed sample surface, the method optionally includes examining the second exposed sample surface, at 48.

As the sample may be incrementally exposed, revealing progressively deeper portions of the sample, the newly exposed sample surface may be examined after every exposure. In this way information about the overall structure of the sample can be obtained, leading to an understanding of the three-dimensional composition and morphology of the sample.

The system and method of the present invention may include one or more of the following exemplary embodiments:

A surface preparation system comprising a microscope sub stage, a beam shield, a beam shield holder and an excitation beam wherein the apparatus prepares substantially planar surfaces on solid samples.

A surface preparation system wherein the microscope substage, sample holder, beam shield holder, and beam shield are mounted inside the vacuum chamber of the "host" analytical or other scientific instrument.

A surface preparation system wherein a real time viewing microscope (LM, SEM, FIB, or AFM) exists for monitoring the progress of the ongoing surface preparation.

A surface preparation system wherein the excitation beam is a produced by an excitation source (ion, electron, or laser) configured to produce an energy beam, transmit the beam through a vacuum interface, and focus the beam onto the beveled beam shield and exposed surface of the sample in either a pulsed or continuous mode.

A surface preparation system wherein the microscope substage comprises a positive-positioned, self-aligning sample holder, a movable beam shield holder, and a beam shield; all configured to position a sample area of interest and top edge of the beam shield in the exact coincident point for processing and viewing.

A surface preparation system wherein the beam shield holder holds and clamps the beam shield in a position just below, and parallel with, the sample's top surface.

A surface preparation system wherein the beam shield holder can move the beam shield in the vertical direction with respect to the sample in increments of less than 1 μm per step.

A surface preparation system wherein the beam shield holder is configured such that the beam shield can be easily changed in order to accommodate wear or to employ the use of alternate materials optimized for alternate excitation sources.

A surface preparation system wherein the beam shield is composed of a material that is processed to have a highly reflective beveled surface that is resistant to photon ablation and has a low coefficient of sputtering.

A surface preparation system wherein the beam shield can be unclamped from the sample, lowered a discrete vertical distance, then re-clamped to the sample in sequence to facilitate multiple milling cycles on sequentially lower regions of the sample.

A surface preparation system wherein the beam shield can also be a louvered shield or diffraction grating.

A surface preparation system wherein the beam shield can be moved laterally to expose un-processed surfaces that avoid the onset of deleterious artifacts resulting from over-etching of the beveled surface of the beam shield.

A method or preparing a sample coupon for microscopic cross section or planametric analysis including steps to mount the sample in the sample holder, mount the beam shield in the beam shield holder, position the beam shield holder such that the beam shield is just below the sample surface, bombard the sample and beam shield with a excitation beam for removing material, view or analyze the process results in real time, move the beam shield incrementally lower, and repeat the process numerous times.

A method of sample preparation wherein a lateral beam strikes the beveled beam shield and exposed sample surface removing a thin layer of the sample surface approximately equivalent to the height of the gap between the sample and the upper edge of the beam shield.

A method of sample preparation wherein the beam shield is unclamped, lowered, and re-clamped against the sample to enable sequential processing steps.

A method of sample preparation that further includes imaging and/or analyzing the sample using detectors or a viewing microscope during or after processing and without removing the sample from the microscope vacuum chamber.

A method of sample preparation, wherein the viewing microscope is a SEM, FIB, LM or AFM and may incorporate multiple data acquisition detectors for chemical or morphometric analysis, including three dimensional reconstruction.

A method of sample preparation, wherein a thin bi-beveled beam shield or diffraction grating can be installed that allows parallel milling of two or more trenches in a sample to create thin lamella for light or transmission electron microscopy.

A method of sample preparation, wherein a louvered beam shield or diffraction grating can be installed in place of the beam shield for preparing alternating, sequential slices in a sample for light microscopy or electron microscopy.

This disclosure describes various sample preparation systems and methods for their use. However, many alternatives and modifications which may or may not be expressly mentioned are enabled, implied, and accordingly covered by the spirit of the disclosure. For example, although microscopy is mentioned repeatedly herein, it should be understood that a variety of analytical techniques may be facilitated by the present systems and methods.

The subject matter of the disclosure includes all novel and non-obvious combinations and subcombinations of the various elements, features, functions and/or properties disclosed herein. Similarly, where the disclosure recites "a" or "a first" element or the equivalent thereof, such disclosure should be understood to include incorporation of one or more such elements, neither requiring nor excluding two or more such elements. Novel and non-obvious combinations and subcombinations of features, functions, elements and/or properties may be claimed through presentation of claims in a related application.

What is claimed is:

1. A sample preparation system comprising:
   a sample support, configured to secure a solid sample;
   an excitation beam source that generates an excitation beam configured to remove material from a surface of the solid sample;
   a beam shield configured to partially protect the solid sample from the excitation beam; and
   a beam shield holder configured to adjustably secure the beam shield;
   wherein vertical adjustment of the beam shield permits the excitation beam to selectively expose a series of substantially planar surfaces of the solid sample.

2. The sample preparation system of claim 1, wherein the sample preparation system is mounted within a vacuum chamber of a microscope or analytical instrument.

3. The sample preparation system of claim 2, wherein the microscope or analytical instrument includes a real time viewing microscope configured to monitor the solid sample surface.

4. The sample preparation system of claim 1, wherein the beam shield includes a highly reflective beveled surface that is resistant to photon ablation and has a low coefficient of sputtering.

5. The sample preparation system of claim 4, wherein the excitation beam source is configured to generate an energy beam that is either pulsed or continuous, transmit the energy beam through a vacuum interface, and focus the energy beam onto the beveled surface of the beam shield and a partially exposed surface of the sample.

6. The sample preparation system of claim 1, wherein the beam shield holder is configured to secure the beam shield so that an upper edge of the beam shield is positioned just below and parallel with the upper surface of the solid sample.

7. The sample preparation system of claim 1, wherein the beam shield holder is configured to permit vertical adjustment of the beam shield with respect to the solid sample in small increments.

8. The sample preparation system of claim 1, wherein the beam shield holder is configured to permit vertical adjustment of the beam shield with respect to the solid sample in of less than about 1 µm.

9. The sample preparation system of claim 7, wherein the beam shield can be vertically adjusted by unclamping the beam shield from the sample, moved incrementally downward, and reclamped to the sample to facilitate multiple surface processing cycles on sequentially lower regions of the sample.

10. The sample preparation system of claim 1, wherein the beam shield holder is configured so that the beam shield is readily removed and/or replaced.

11. The sample preparation system of claim 1, wherein the beam shield includes a plurality of parallel slits.

12. The sample preparation system of claim 11, wherein the parallel slits are configured so that the beam shield diffracts the energy beam.

13. The sample preparation system of claim 1, wherein the beam shield is laterally adjustable, so that an unprocessed surface of the sample can be exposed.

14. The sample preparation system of claim 1, wherein the energy beam is an ultrafast laser beam.

15. The sample preparation system of claim 1, wherein the sample preparation system is mounted within a vacuum chamber of a microscope; and the beam shield holder is configured to secure the beam shield so that an upper edge of the beam shield can be positioned just below and parallel with the upper surface of the solid sample and subsequently moved incrementally downward in small increments to permit the preparation of multiple prepared sample surfaces in sequentially lower regions of the sample.

16. A sample preparation system comprising:
   a sample support, configured to secure a solid sample;
   an excitation beam source that generates an excitation beam configured to remove material from a surface of the solid sample;
   a beam shield configured to protect the solid sample from the excitation beam; and
   a beam shield holder configured to adjustably secure the beam shield;
   wherein the sample preparation system is mounted within a vacuum chamber of a microscope or analytical instrument configured to monitor the solid sample.

17. A method of preparing an analytical sample, comprising:
   securing a sample in a sample holder;
   mounting a beam shield so that the beam shield is positioned just below and parallel with an upper surface of the sample;
   exposing the sample to an excitation beam configured to remove sample material and generate a first exposed sample surface;
   adjusting the position of the beam shield incrementally lower; and
   exposing the sample to the excitation beam to remove additional sample material and generate a second exposed sample surface.

18. The method of claim 17, wherein the exposed sample surfaces are examined using an electron microscope, a focused ion beam, a light microscope, or an atomic force microscope.

19. The method of claim 17, wherein the steps of adjusting the position of the beam shield incrementally lower and exposing the sample to the excitation beam are repeated sequentially multiple times.

20. The method of claim 17, wherein adjusting the position of the beam shield incrementally lower includes releasing the beam shield, incrementally lowering the beam shield, and resecuring the beam shield adjacent the sample.

21. The method of claim 17, further comprising alternating cycles of surface processing and examination of the exposed sample surface.

22. The method of claim 17, wherein the sample is mounted within a vacuum chamber of a microscope or analytical instrument.

23. The method of claim 22, wherein examining the exposed sample surface includes the acquisition of at least one microscopic reference image directly following a surface processing cycle and before venting the vacuum chamber.

24. The method of claim 22, wherein the first and second exposed sample surfaces are examined without removing the sample from the sample holder or venting the vacuum chamber.

25. The method of claim 22, further comprising chemical or morphometric analysis of the exposed sample surfaces either during processing or immediately following processing and without venting the vacuum chamber.

26. The method of claim 21, further comprising generating a three-dimensional model of the sample, where the three-dimensional model is constructed from algorithmic assembly of data acquired at sequential sample surface layers.

\* \* \* \* \*